United States Patent
Huang et al.

(10) Patent No.: US 9,413,310 B2
(45) Date of Patent: Aug. 9, 2016

(54) SOURCE DRIVER OUTPUT STAGE CIRCUIT, BUFFER CIRCUIT AND VOLTAGE ADJUSTING METHOD THEREOF

(75) Inventors: Kuo-Chan Huang, Hsinhua (TW); Chih-Haur Huang, Hsinhua (TW)

(73) Assignee: HIMAX TECHNOLOGIES LIMITED, Tainan County (TW)

( * ) Notice: Subject to any disclaimer, the term of this patent is extended or adjusted under 35 U.S.C. 154(b) by 2774 days.

(21) Appl. No.: 11/594,774

(22) Filed: Nov. 9, 2006

(65) Prior Publication Data
US 2007/0103208 A1 May 10, 2007

(30) Foreign Application Priority Data
Nov. 9, 2005 (TW) ................................ 94139331 A

(51) Int. Cl.
*H03F 3/217* (2006.01)

(52) U.S. Cl.
CPC ........ *H03F 3/217* (2013.01); *G09G 2310/0275* (2013.01); *G09G 2320/0252* (2013.01); *G09G 2330/021* (2013.01); *G09G 2330/028* (2013.01); *H03F 2200/78* (2013.01)

(58) Field of Classification Search
CPC .................. G09G 2330/021; G09G 2330/028; G09G 2200/78

USPC ............................................... 345/204, 76, 55
See application file for complete search history.

(56) References Cited

U.S. PATENT DOCUMENTS

| 2003/0107535 A1* | 6/2003 | Numao | 345/76 |
| 2006/0139253 A1* | 6/2006 | Choi et al. | 345/76 |
| 2006/0244706 A1* | 11/2006 | Kojima | 345/98 |

FOREIGN PATENT DOCUMENTS

| JP | 09-008570 A | 1/1997 |
| JP | 2005-172874 | * 6/2005 |

* cited by examiner

*Primary Examiner* — William Boddie
*Assistant Examiner* — Leonid Shapiro
(74) *Attorney, Agent, or Firm* — Rabin & Berdo, P.C.

(57) ABSTRACT

A buffer circuit applied to a source driver output stage circuit includes a buffer and a D-class amplifier. The buffer is coupled to an input voltage for accordingly outputting an output voltage. The D-class amplifier includes a comparator and a switch device. The comparator is for comparing the input voltage and the output voltage and accordingly outputting a comparison signal. The switch device is coupled to an operational voltage for adjusting the output voltage according to the comparison signal.

3 Claims, 4 Drawing Sheets

SOURCE DRIVER OUTPUT STAGE CIRCUIT, BUFFER CIRCUIT AND VOLTAGE ADJUSTING METHOD THEREOF

This application claims the benefit of Taiwan application Serial No. 94139331, filed Nov. 9, 2005 the subject matter of which is incorporated herein by reference.

BACKGROUND OF THE INVENTION

1. Field of the Invention

The invention relates in general to a source driver output stage circuit, buffer circuit and voltage adjusting method thereof, and more particularly to a source driver output stage circuit with an AD-class output structure, buffer circuit and voltage adjusting method thereof.

2. Description of the Related Art

FIG. 1 is a block diagram of a conventional source driver output stage circuit. A conventional source driver output stage circuit 100 includes a high-voltage output buffer (Buffer_HV) 110, a low-voltage output buffer (Buffer_LV) 120 and a multiplexer 130. The high-voltage output buffer 110 and the low-voltage output buffer 120 are respectively coupled to high and low analog input voltages Vh and Vl, such as 12V and 0V, for adjusting output voltages Vo1 and Vo2 to have the same values as the voltages Vh and Vl in a charging/discharging way. Afterwards, a polarity-inversion operation is performed on the output voltages Vo1 and Vo2 for supplying an enough pixel current to the display panel 140.

However, the conventional buffers 110 and 120 are implemented by A-class amplifiers and have issues of high electricity consumption and inadequate power efficiency and driving power. In some cases, the buffers 110 and 120 may be implemented by AB-class amplifiers to improve power efficiency, which increases an area of the output stage circuit 100 instead. Moreover, no matter whether the A-class or AB-class output structure is used, there exists an issue of chip overheating due to too high temperature.

SUMMARY OF THE INVENTION

It is therefore an object of the invention to provide a source driver output stage circuit and buffer circuit thereof. An AD-class output structure is used to solve the above issues and improve the drawback of chip over-heating. Therefore, the source driver can have a higher driving power for pixel display. Not only its power efficiency can be improved, but also its volume can be reduced.

The invention achieves the above-identified object by providing a buffer circuit applied to a source driver output stage circuit. The buffer circuit includes a buffer and a D-class amplifier. The buffer is coupled to an input voltage for accordingly outputting an output voltage. The D-class amplifier includes a comparator and a switch device. The comparator is for comparing the input voltage and the output voltage and accordingly outputting a comparison signal. The switch device is coupled to an operational voltage for adjusting the output voltage according to the comparison signal.

The invention achieves the above-identified object by providing a source driver output stage circuit including a first buffer circuit and a second buffer circuit. The first buffer circuit includes a first buffer and a first D-class amplifier, and the second buffer circuit includes a second buffer and a second D-class amplifier. The first buffer is coupled to a first input voltage for accordingly outputting a first output voltage. The first D-class amplifier includes a first comparator and a first switch device. The first comparator is for comparing the first input voltage and the first output voltage and accordingly outputting a first comparison signal. The first switch device is coupled to a first operational voltage for adjusting the first output voltage according to the first comparison signal. The second buffer is coupled to a second input voltage for accordingly outputting a second output voltage. The second D-class amplifier includes a second comparator and a second switch device. The second comparator is for comparing the second input voltage and the second output voltage and accordingly outputting a second comparison signal. The second switch device is coupled to a second operational voltage for adjusting the second output voltage according to the second comparison signal.

The invention achieves the above-identified object by providing a voltage adjusting method applied to a source driver output stage circuit. The source driver output stage circuit includes a buffer circuit coupled to an input voltage for accordingly outputting an output voltage. The voltage adjusting method includes determining if absolute difference of the output voltage and the input voltage is larger than a offset voltage, and if the absolute difference is large than the offset voltage, adjusting the output voltage towards the input voltage at a first voltage adjusting rate; and adjusting the output voltage towards the input voltage at a second voltage adjusting rate if the absolute difference is smaller than the offset voltage, wherein the first voltage adjusting rate is larger than the second voltage adjusting rate.

Other objects, features, and advantages of the invention will become apparent from the following detailed description of the preferred but non-limiting embodiments. The following description is made with reference to the accompanying drawings.

DETAILED DESCRIPTION OF THE INVENTION

Figure 1:
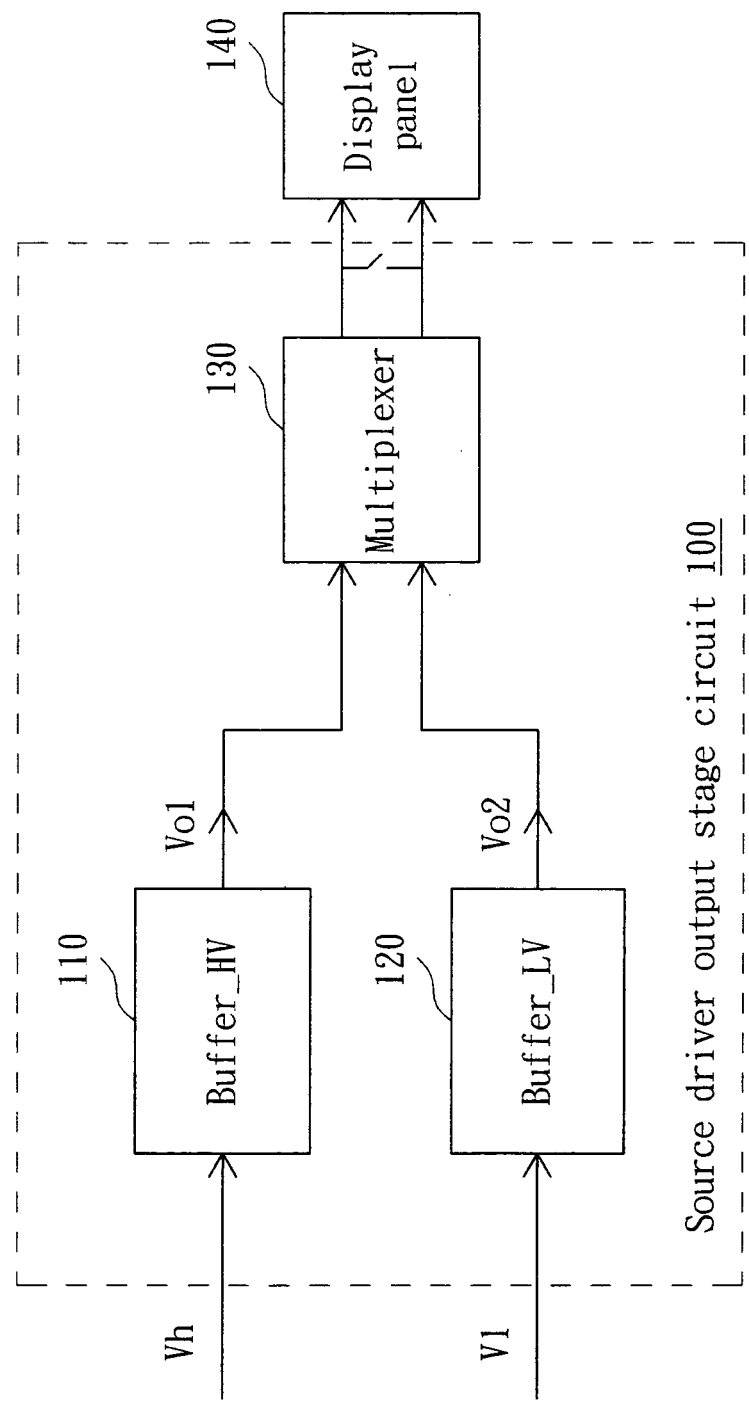
FIG. 1 a block diagram of a conventional source driver output stage circuit.
Figure 2:
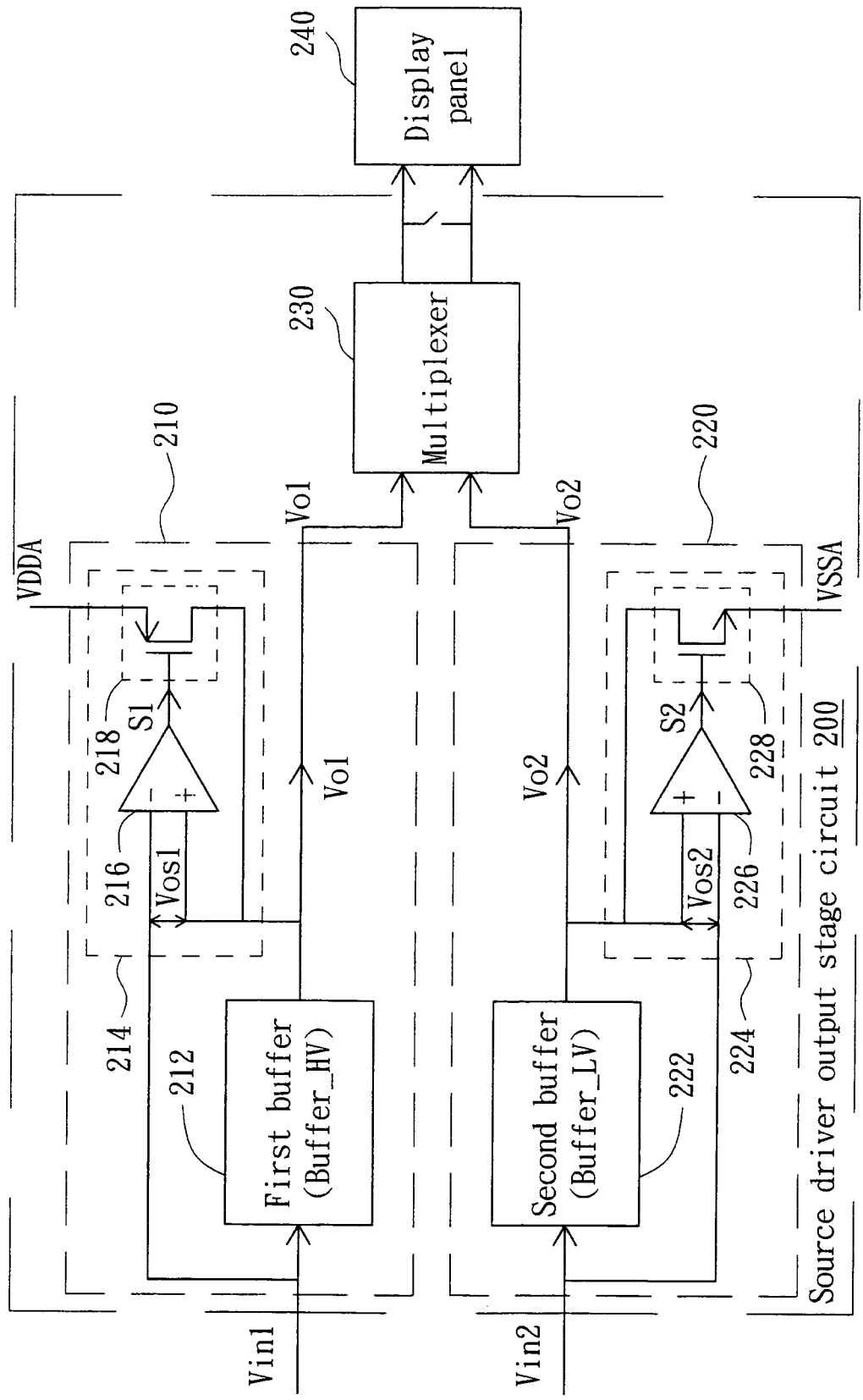
FIG. 2 is a block diagram of a source driver output stage circuit according to a preferred embodiment of the invention.

Referring to FIG. 2, a block diagram of a source driver output stage circuit according to a preferred embodiment of the invention is shown. A source driver output stage circuit 200 includes a first buffer circuit 210, a second buffer circuit 220 and a multiplexer 230. The first buffer circuit 210 and the second buffer circuit 220 are respectively coupled to a first input voltage Vin1 and a second input voltage Vin2 and accordingly output a first output voltage Vo1 and a second output voltage Vo2 to the multiplexer 230. In the multiplexer 230, a polarity inversion operation is performed on the output voltages Vo1 and Vo2 for supplying an enough pixel current to the display panel 240. The first buffer circuit 210 includes a first buffer 212 and a first D-class amplifier 214. The first buffer 212, such as a high-voltage output buffer (Buffer_HV), is coupled to the first input voltage Vin1, such as 12V, for accordingly outputting the first output voltage Vo1.

The first D-class amplifier 214 includes a first comparator 216 and a first switch device 218. The first comparator 216 is for comparing the first input voltage Vin1 and the first output voltage Vo1 and accordingly outputting a first comparison signal S1. The first comparator 216 has a positive input terminal (+) coupled to the first output voltage Vo1 and a negative input terminal (−) coupled to the first input voltage Vin1. The first comparator 216 has a first offset voltage Vos1, such as 50 mV. Furthermore, the first switch device 218, such as a P-type metal oxide semiconductor (PMOS) transistor, has a source coupled to an operational voltage VDDA, a gate coupled to an output terminal of the first comparator 216 and a drain coupled to the positive input terminal (+) of the first comparator 216. The operational voltage VDDA is not smaller than the input voltage Vin1 (12V). The first switch device 218 is for adjusting the first output voltage Vo1 according to the first comparison signal S1.

In addition, the second buffer circuit 220 includes a second buffer 222 and a second D-class amplifier 224. The second buffer 222, such as a low-voltage output buffer (Buffer_LV), is coupled to the second input voltage Vin2, such as 0V, for accordingly outputting the second output voltage Vo2. The second D-class amplifier 224 includes a second comparator 226 and a second switch device 228. The second comparator 226 is for comparing the second input voltage Vin2 and the second output voltage Vo2 and accordingly outputting a second comparison signal S2. The second comparator 226 has a positive input terminal (+) coupled to the second output voltage Vo2 and a negative input terminal (−) coupled to the second input voltage Vin2. The second comparator 226 has a second offset voltage Vos2, such as 50 mV. The second switch device 228, such as a N-type metal oxide semiconductor (NMOS) transistor, has a source coupled to an operational voltage VSSA, a gate coupled to an output terminal of the second comparator 226 and a drain coupled to the positive input terminal (+) of the second comparator 226. The operational voltage VSSA is not larger than the input voltage Vin2 (0V). The second switch device 228 is for adjusting the second output voltage Vo2 according to the second comparison signal S2.

Figure 3:
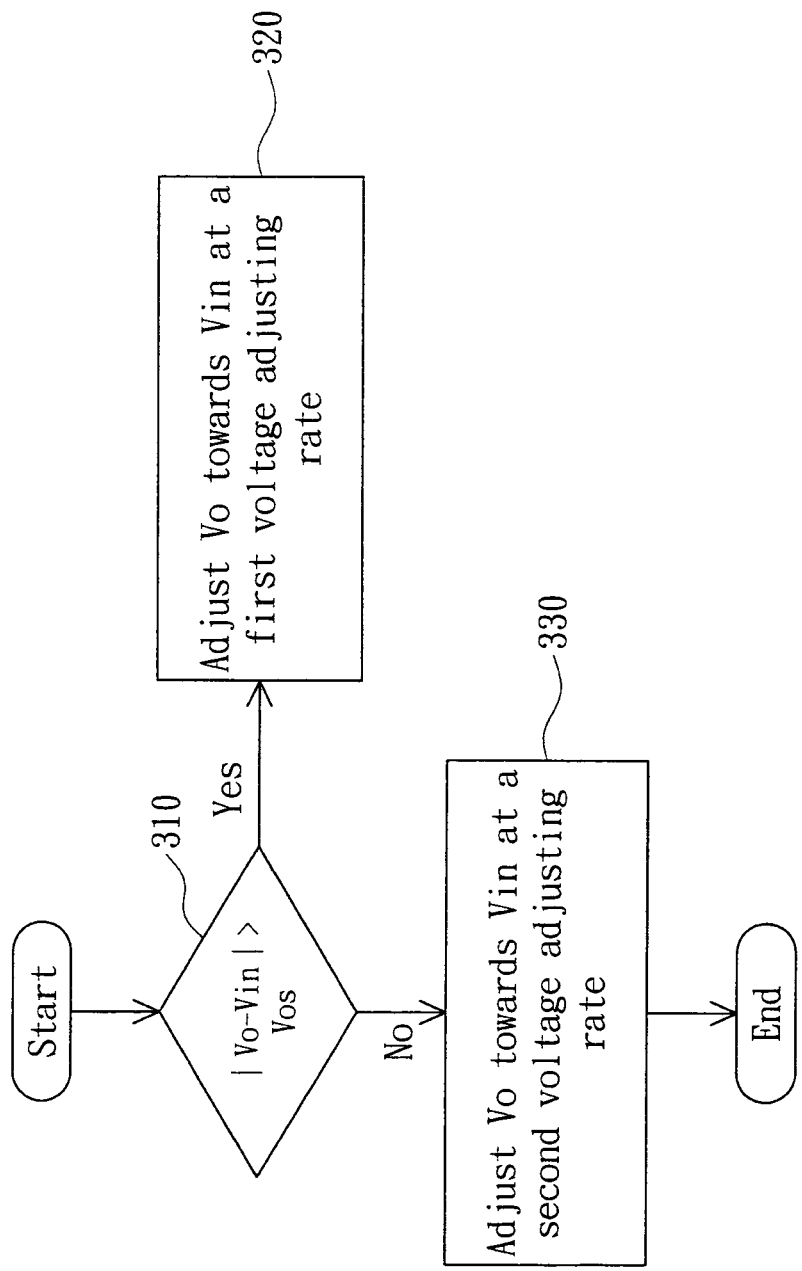
FIG. 3 is a flow chart of a voltage adjusting method according to the preferred embodiment of the invention.

Referring to FIG. 3, a flow chart of a voltage adjusting method according to the preferred embodiment of the invention is shown. First, in step 310, determine if an absolute difference |Vo−Vin|(|Vo1−Vin1|or |Vo2−Vin2|) of an output voltage Vo (Vo1 or Vo2) and an input voltage Vin (Vin1 or Vin2) is larger than an offset voltage Vos (Vos1 or Vos2). For example, the above first comparator 216 or second comparator 226 is used to compare the first output voltage Vo1 and the first input voltage Vin1 or to compare the second output voltage Vo2 and the second input voltage Vin2. If the absolute difference |Vo1−Vin1| or |Vo2−Vin2| is larger than the offset voltage Vos1 or Vos2, a step 320 is performed to adjust the output voltage Vo1 or Vo2 towards the input voltage Vin1 or Vin2 at a first voltage adjusting rate m1. For example, under a D-class output structure, the first comparison signal S1 or the second comparison signal S2 is outputted by the first comparator 216 or the second comparator 226 for turning on the first switch device 218 or the second switch device 228 to output the operational voltage VDDA or VSSA to the positive input terminal (+) of the first comparator 216 or the second comparator 226 such that the first output voltage Vo1 can be adjusted upwards to the first input voltage Vin1 or the second output voltage Vo2 can be adjusted downwards to the second input voltage Vin2 at the first voltage adjusting rate m1.

Following that, in step 330, when the absolute difference Vo−Vin |Vo1−Vin1 | or |Vo2−Vin2|) is not larger than the offset voltage Vos (Vos1 or Vos2), adjust the output voltage Vo (Vo1 or Vo2) towards the input voltage Vin (Vin1 or Vin2) at a second voltage adjusting rate m2, wherein the first voltage adjusting rate m1 is larger than the second voltage adjusting rate m2. For example, the first comparison signal S1 or the second comparison signal S2 is outputted by the first comparator 216 or the second comparator 226 to turn off the first switch device 218 or the second switch device 228 and then the first buffer 212 or the second buffer 222 with an A-class output structure is used to adjust the first output voltage Vo1 upwards to the first input voltage Vin1 or to adjust the second output voltage Vo2 downwards to the second input voltage Vin2 at a second voltage adjusting rate m2. Then, the process is ended.

Figures 4A, 4B:
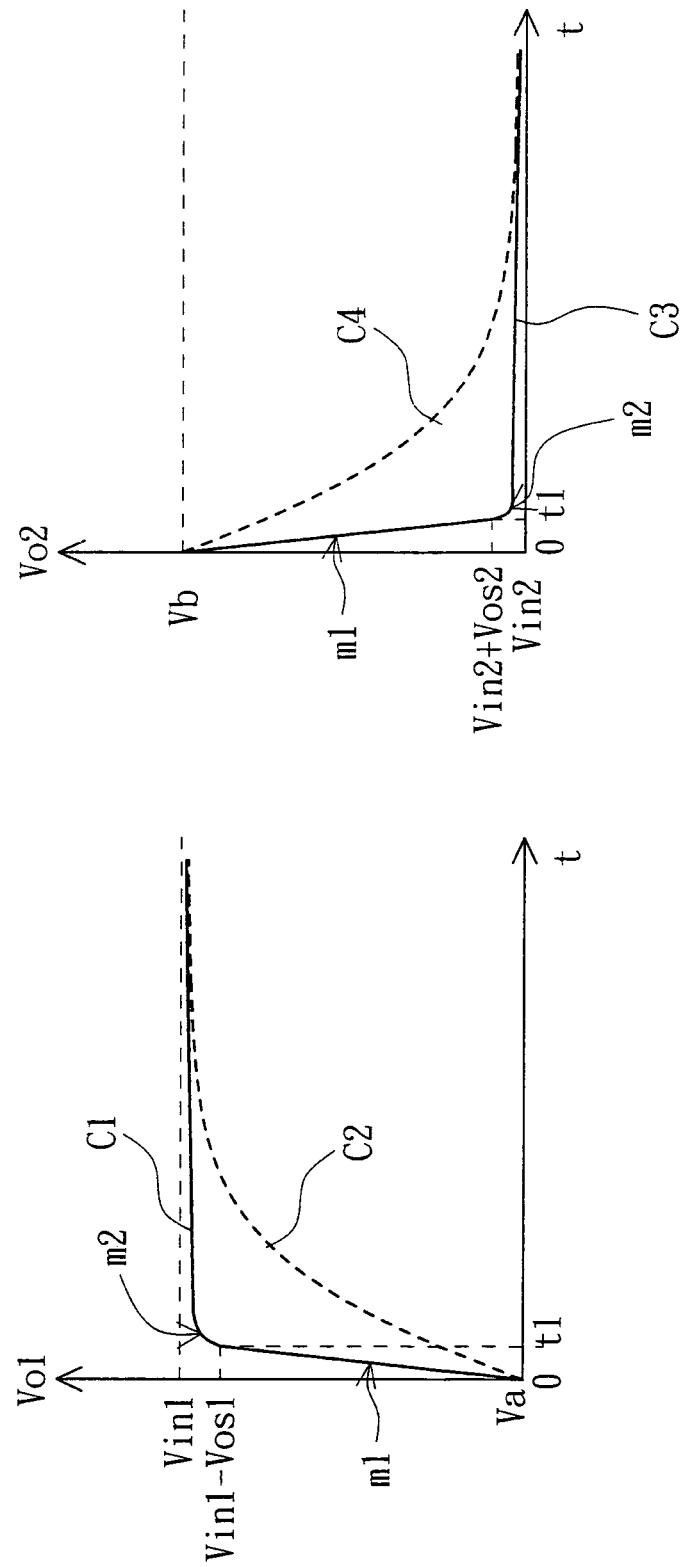
FIG. 4A is a comparison diagram of a functional curve of the output voltage of the first buffer circuit in FIG. 2 relative to time and a conventional curve of the output voltage of the first buffer relative to time.
FIG. 4B is a comparison diagram of a functional curve of the output voltage of the second buffer circuit in FIG. 2 relative to time and a conventional curve of the output voltage of the second buffer relative to time.

Referring to FIG. 4A, a comparison diagram of a functional curve C1 of the output voltage Vo1 of the first buffer circuit 210 in FIG. 2 relative to time and a conventional curve C2 of the output voltage Vo1 of the first buffer 212 relative to time is shown. When the first input voltage Vin1 is inputted to the first buffer 212 (with an A-class output structure commonly), the first output voltage Vo1 rises up gradually from an initial voltage Va. The initial voltage Va, such as 9V, is usually located between Vin1/2 and Vin1. Conventionally, when the first D-class amplifier 214 is unused, the output voltage Vo1 is gradually increased from the initial voltage Va to a value of the first input voltage Vin1 (12V) along the dotted curve C2.

However, in the first buffer circuit 210 of the embodiment, the first input voltage Vin1 is also inputted to a negative input terminal (−) of the first comparator 216 and the first output voltage Vo1 is inputted to the positive input terminal (+) of the first comparator 216. In the beginning, owing that the difference of the voltage Vin1 (12V) at the negative input terminal (−) and the voltage Va (9V) at the positive input terminal (+) is larger than the first offset voltage. Vos1 (50 mV), the first comparison signal S1 is outputted to have a low voltage level 0V. At the time, the PMOS transistor 218 has a source voltage (12V) larger than its gate voltage (0V) by at least a threshold voltage (about 0.7V), and thus the PMOS transistor 218 is turned on to output the operational voltage VDDA to the positive input terminal (+) of the first comparator 216 such that the first output voltage Vo1 can be increased along the solid curve C1 at the first voltage adjusting rate m1, wherein m1=(Vin1−Vos1−Va)/t1.

Until the time point t2 when the absolute difference |Vo1− Vin1| of the first output voltage Vo1 and the first input voltage Vin1 becomes not larger than the first offset voltage Vos1, i.e. the first output voltage Vo1=Vin1−Vos1, the first comparison signal S1 is outputted to have a high voltage level 12V such that the first switch device 218 is turned off and the first buffer 212 continuously lifts the first output voltage Vo1 towards the first input voltage Vin1 (12V) at the second voltage adjusting rate m2 (<m1). Therefore, the first buffer circuit 210 with an AD-class output structure in the invention can generate the output voltage Vo1 at a voltage adjusting rate (along the curve C1) higher than the conventional output voltage adjusting rate (along the curve C2), thereby effectively improving the power efficiency.

Referring to FIG. 4B, a comparison diagram of a functional curve C3 of the output voltage Vo2 of the second buffer circuit 220 in FIG. 2 relative to time and a conventional curve C2 of the output voltage Vo2 of the second buffer 222 relative to time is shown. When the second input voltage Vin2 is inputted to the second buffer 222 (with an A-class output structure commonly), the second output voltage Vo2 drops gradually from an initial voltage Vb. The initial voltage Vb, such as 3V, is usually located between Vin1/2 and Vin2. Conventionally, when the second D-class amplifier 224 is unused, the output voltage Vo2 is decreased gradually from the initial voltage Vb to a value of the second input voltage Vin2 (0V) along the dotted curve C4.

However, in the second buffer circuit 220 of the embodiment, the second input voltage Vin2 is also inputted to a negative input terminal (−) of the second comparator 226 and the second output voltage Vo2 is inputted to the positive input terminal (+) of the second comparator 216. In the beginning, owing that the difference of the voltage Vb (3V) at the positive input terminal (+) and the voltage Vin1 (0V) at the negative input terminal (−) is larger than the second offset voltage Vos2 (50 mV), the second comparison signal S2 is outputted to have a high voltage level 12V. At the time, the NMOS transistor 228 has a gate voltage (12V) larger than its source voltage (0V) by at least a threshold voltage (about 0.7V), and thus the NMOS transistor 228 is turned on to output the operational voltage VSSA to the positive input terminal (+) of the second comparator 226 such that the second output voltage Vo2 can be lowered down along the solid curve C3 at the first voltage adjusting rate m1, wherein m1=(Vb−Vin2−Vos1)/t2.

Until the time point t2 when the absolute difference |Vo2−Vin2| of the second output voltage Vo2 and the second input voltage Vin2 becomes not larger than the second offset voltage Vos2, i.e. the second output voltage Vo2=Vin2+Vos2, the second comparison signal S2 is outputted to have a low voltage level 0V such that the second switch device 228 is turned off and the second buffer 222 continuously lowers down the second output voltage Vo2 towards the second input voltage Vin2 (0V) at the second voltage adjusting rate m2 (<m1). Therefore, the second buffer circuit 220 with an AD-class output structure in the invention can generate the output voltage Vo2 at a voltage adjusting rate (along the curve C4) higher than the conventional output voltage adjusting rate (along the curve C3), thereby effectively improving the power efficiency.

It is noted that the first buffer circuit 210 or the second buffer circuit 220 of the invention can adjust a power consumption ratio of the first buffer 212 and the first D-class amplifier 214 or a power consumption ratio of the second buffer 222 and the second D-class amplifier 224. For example, in the embodiment, the first input voltage is 12V, the first output voltage Vo1 has the initial voltage Va equal to 9V, and the first offset voltage Vos1 is 50 mV. Therefore, the first D-class amplifier 214 is responsible to raise the first output voltage Vo1 from 9V to 11.95V (59/60), and the left voltage 0.05V (1/60) is distributed by the first buffer 212. That is, if the power consumption of the conventional first buffer 212 is A, and the power consumption of the D-class amplifier 214 is B (<A), the AD-class output structure of the invention has a power consumption (A/60+59*B/60), which is smaller than A. Moreover, as the offset voltage Vos1 is getting smaller, the first buffer circuit 210 has even smaller power consumption. Similarly, when the offset voltage Vos2 is getting smaller, the second buffer circuit 220 can have smaller power consumption. Therefore, power consumption of the source driver output stage circuit 200 can be effectively reduced to improve the overall power efficiency.

As mentioned above, the source driver output stage circuit 200 of the invention can include the first buffer 212 and the second buffer 222 implemented by AB-class power amplifiers or even other non-D-class power amplifiers for supplying the output voltages Vo1 and Vo2 in combination with the first D-class amplifier 214 and the second D-class amplifier 224 in order to achieve the purpose of reducing power consumption and improving power efficiency.

Although the first switch device 218 is exemplified to be a PMOS transistor and the second switch device 228 is exemplified to be a NMOS transistor for illustration in the invention, the first D-class amplifier 214 and the second D-class amplifier 224 of the invention can also use any other kind of switch device. As long as when the switch device is turned on, the operational voltage VDDA or VSSA is inputted to the positive input terminal of the comparator 216 or 226 to adjust the output voltage Vo1 or Vo2 towards the input voltage Vin1 or Vin2 at the first voltage adjusting rate m1 which is lager than the second voltage adjusting rate m2, the purpose of improving power efficiency can also be achieved. Besides, the comparator 216 (or 226) can also be coupled to the first (or the second) input voltage via the positive input terminal and be coupled to the first (or the second) output voltage via the negative input terminal. By collocating the first (or the second) switch device, the first (or the second) output voltage is adjusted close to the first (or the second) input voltage at a larger (D-class) voltage adjusting rate first and continuously be adjusted to the value of the first (or the second) input voltage at a smaller (A-class or AB-class) voltage adjusting rate to achieve the purpose of improving power efficiency. Therefore, all the alternatives are not apart from the scope of the invention.

The source driver output stage circuit, buffer circuit and voltage adjusting method thereof disclosed by the above embodiment of the invention has the following advantages:

1. The source driver output stage circuit with an AD-class output structure in the invention can increase its driving power, lower down its power consumption and improve its power efficiency from 50% to over 70%.

2. The offset voltage of the comparator in the D-class amplifier can be adjusted for controlling the power consumption ratio of the buffer (A-class) and the D-class amplifier, thereby improving a voltage adjusting efficiency of the source driver output stage circuit.

3. By using an AD-class output structure, the source driver output stage circuit can have higher voltage adjusting rate or spend less voltage adjusting time in adjusting the output voltage towards the input voltage, thereby effectively improving a voltage outputting efficiency.

4. The D-class amplifier in the buffer circuit of the invention includes only a comparator and switch device with a simple structure, which do not occupy too much area. Besides, owing that the buffer is responsibly for small-range voltage modulation in the latter-half period, it consumes less power. Therefore, the buffer can have a simplified structure and smaller area, the purpose of reducing area and power consumption of the source driver output stage circuit can be achieved, and thus the invention can be widely applied to a large-scale panel.

5. The source driver output stage circuit with an AD-class output structure in the invention can transfer more heat to the display panel for effectively solving the prior-art issue of chip over-heating.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A voltage adjusting method, applied to a source driver output stage circuit, the source driver output stage circuit comprising a buffer coupled to an input voltage for accordingly outputting an output voltage and adjusting the output voltage towards the input voltage at a predetermined voltage adjusting rate, the voltage adjusting method comprising:

determining if the absolute value of the difference between the output voltage and the input voltage is larger than an offset voltage, and if the absolute value of the difference between the output voltage and the input voltage is larger than the offset voltage, adjusting the output voltage toward the input voltage at a first voltage adjusting rate, wherein the first voltage adjusting rate is larger than the predetermined voltage adjusting rate; and adjusting the output voltage towards the input voltage at a second voltage adjusting rate if the absolute difference between the output voltage and the input voltage is smaller than the offset voltage, wherein the first voltage adjusting rate is larger than the second voltage adjusting rate.

2. The voltage adjusting method according to claim 1, wherein the output voltage has an initial voltage value, and the absolute difference between the initial voltage value and the input voltage is larger than the offset voltage.

3. The voltage adjusting method according to claim 1, wherein the offset voltage is for controlling power consumption of the source driver output stage circuit.

\* \* \* \* \*